United States Patent
Kanaoka et al.

(10) Patent No.: US 11,014,169 B2
(45) Date of Patent: May 25, 2021

(54) SURFACE-COATED CUTTING TOOL AND METHOD FOR MANUFACTURING THE SAME

(71) Applicant: Sumitomo Electric Hardmetal Corp., Itami (JP)

(72) Inventors: Hideaki Kanaoka, Sorachi-gun (JP); Shinya Imamura, Sorachi-gun (JP); Anongsack Paseuth, Sorachi-gun (JP); Satoshi Ono, Sorachi-gun (JP); Kouhei Yoshimura, Sorachi-gun (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 41 days.

(21) Appl. No.: 16/328,225

(22) PCT Filed: Apr. 25, 2017

(86) PCT No.: PCT/JP2017/016402
§ 371 (c)(1),
(2) Date: Feb. 25, 2019

(87) PCT Pub. No.: WO2018/037623
PCT Pub. Date: Mar. 1, 2018

(65) Prior Publication Data
US 2019/0210116 A1    Jul. 11, 2019

(30) Foreign Application Priority Data
Aug. 25, 2016 (JP) .............................. JP2016-164782

(51) Int. Cl.
*B23B 27/14* (2006.01)
*B23C 5/16* (2006.01)
(Continued)

(52) U.S. Cl.
CPC ............ *B23B 27/148* (2013.01); *B23B 27/14* (2013.01); *B23B 51/00* (2013.01); *B23C 5/16* (2013.01);
(Continued)

(58) Field of Classification Search
CPC ... B23B 27/148; B23B 27/14; B23B 2224/04; C23C 16/403; C23C 16/56
(Continued)

(56) References Cited

U.S. PATENT DOCUMENTS 7,431,747 B2 * 10/2008 Heinrich ............... B23B 27/148
428/698
2007/0148498 A1    6/2007 Park et al.
(Continued)

FOREIGN PATENT DOCUMENTS

CN    102821897 A    12/2012
EP    1867755 A2    12/2007
(Continued)

*Primary Examiner* — Archene A Turner
(74) *Attorney, Agent, or Firm* — Baker Botts L.L.P.; Michael A. Sartori

(57) ABSTRACT

A surface-coated cutting tool having a rake face and a flank face includes a base material and a coating formed on the base material. The base material is a cemented carbide or a cermet. The coating includes an aluminum oxide layer containing a plurality of aluminum oxide crystal grains. The aluminum oxide layer includes: a first region made up of a region A on the rake face and a region B on the flank face; a second region on the rake face except for the region A; and a third region on the flank face except for the region B. The aluminum oxide layer satisfies a relation: b−a>0.5, where a is an average value of TC(110) in the first region in texture coefficient TC(hkl), and b is an average value of TC(110) in the second or third region in texture coefficient TC(hkl).

11 Claims, 5 Drawing Sheets

(51) Int. Cl.
    *B23B 51/00*     (2006.01)
    *C22C 29/08*     (2006.01)
    *C23C 16/40*     (2006.01)
    *C22C 29/04*     (2006.01)
    *C23C 16/34*     (2006.01)
    *C23C 16/36*     (2006.01)
    *C23C 16/56*     (2006.01)

(52) U.S. Cl.
    CPC .............. *C22C 29/04* (2013.01); *C22C 29/08* (2013.01); *C23C 16/34* (2013.01); *C23C 16/36* (2013.01); *C23C 16/40* (2013.01); *C23C 16/403* (2013.01); *C23C 16/56* (2013.01); *B23B 2224/04* (2013.01)

(58) Field of Classification Search
    USPC .......... 51/307, 309; 428/472, 698, 701, 702; 427/299, 331, 368
    See application file for complete search history.

(56) References Cited

U.S. PATENT DOCUMENTS

| | | | |
|---|---|---|---|
| 2007/0227298 A1* | 10/2007 | Tanibuchi | C22C 29/08 75/241 |
| 2008/0299314 A1* | 12/2008 | Ruppi | C23C 28/044 427/255.34 |
| 2013/0022420 A1 | 1/2013 | Waki et al. | |
| 2014/0377024 A1 | 12/2014 | Sobana et al. | |
| 2017/0259345 A1 | 9/2017 | Detani et al. | |

FOREIGN PATENT DOCUMENTS

| | | | |
|---|---|---|---|
| JP | 8-92685 A | | 4/1996 |
| JP | 2002-120105 | * | 4/2002 |
| JP | 2008-69420 A | | 3/2008 |
| JP | 2009-006439 A | | 1/2009 |
| JP | 2012-213853 A | | 11/2012 |
| JP | 2014-166657 A | | 9/2014 |
| JP | 5904389 B1 | | 4/2016 |
| KR | 10-2007-0120067 A | | 12/2007 |

* cited by examiner

SURFACE-COATED CUTTING TOOL AND METHOD FOR MANUFACTURING THE SAME

TECHNICAL FIELD

The present invention relates to a surface-coated cutting tool and a method for manufacturing the surface-coated cutting tool. The present application claims priority to Japanese Patent Application No. 2016-164782 filed on Aug. 25, 2016, the disclosure of which is hereby incorporated by reference in its entirety.

BACKGROUND ART

Various techniques have been proposed with the aim of improving the performance of a surface-coated cutting tool, such as a technique for improving the quality of the coating by varying the texture coefficients of $Al_2O_3$. For example, Japanese Patent No. 5904389 (PTL 1) discloses a surface-coated cutting tool including a base material and a coating on the base material. In the coating, TC(006) in texture coefficient TC(hkl) in the vicinity of the cutting edge is made lower than that in the remaining region to thereby suppress sudden chipping of the cutting edge while maintaining a high thermal conductivity.

Japanese Patent Laying-Open No. 2012-213853 (PTL 2) discloses a coated cutting tool insert produced by forming a coating layer on a base material and performing a surface treatment on the coating layer. The insert has wear resistance and toughness improved by controlling the diffraction intensity ratio I(012)/I(024) under x-ray diffractometry.

CITATION LIST

Patent Literature

PTL 1: Japanese Patent No. 5904389
PTL 2: Japanese Patent Laying-Open No. 2012-213853

SUMMARY OF INVENTION

A surface-coated cutting tool according to an aspect of the present disclosure is a surface-coated cutting tool having a rake face and a flank face. The surface-coated cutting tool includes a base material and a coating formed on the base material. The base material is a cemented carbide or a cermet. The coating includes an aluminum oxide layer containing a plurality of aluminum oxide crystal grains. The aluminum oxide layer includes: a first region made up of a region A on the rake face and a region B on the flank face; a second region on the rake face except for the region A; and a third region on the flank face except for the region B. The region A is a region from an edge ridgeline to an imaginary line on the rake face, wherein the edge ridgeline is a line at which an imaginary extension of the rake face and an imaginary extension of the flank face cross each other, and the imaginary line on the rake face is a line extending along the edge ridgeline and located 1 mm away from the edge ridgeline. The region B is a region from the edge ridgeline to an imaginary line on the flank face, wherein the imaginary line on the flank face is a line extending along the edge ridgeline and located 1 mm away from the edge ridgeline. The aluminum oxide layer satisfies a relation: b−a>0.5, where a is an average value of a TC(110) in the first region in texture coefficient TC(hkl), and b is an average value of the TC(110) in the second region or the third region in texture coefficient TC(hkl).

A method for manufacturing a surface-coated cutting tool according to an aspect of the present disclosure is a method for manufacturing the above-described surface-coated cutting tool. The method includes: forming the coating on the base material; and performing a surface treatment on a portion of the coating, the portion corresponding to the first region.

DETAILED DESCRIPTION

Figure 1:
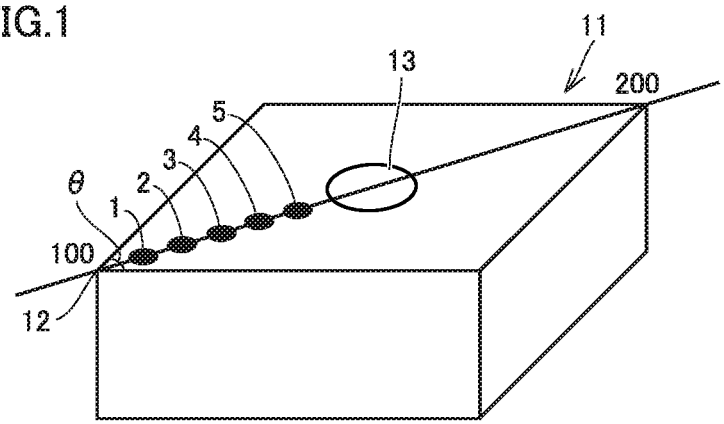
FIG. 1 is an explanatory diagram schematically showing measurement points at five locations on a surface-coated cutting tool to be irradiated with x-ray for calculating TC(hkl) by x-ray diffractometry.

Problem to be Solved by the Present Disclosure

As for the surface-coated cutting tool of PTL 1, however, the adhesion between the base material and the coating, specifically the function of preventing peel-off of the coating during cutting, for example, leaves a room for improvement. The cutting tool of PTL 2 is insufficient in chipping resistance.

In view of the above, an object of the present disclosure is to provide a surface-coated cutting tool having improved resistance to coating fracture including peel-off and chipping, for example (hereinafter also referred to as "fracture resistance"), as well as a method for manufacturing the surface-coated cutting tool.

Advantageous Effect of the Present Disclosure

According to the foregoing, a surface-coated cutting tool with improved resistance to coating fracture including peel-off and chipping, for example is provided.

Description of Embodiments

First of all, the present invention is described based on aspects listed below.

[1] A surface-coated cutting tool according to an aspect of the present disclosure is a surface-coated cutting tool having a rake face and a flank face. The surface-coated cutting tool includes a base material and a coating formed on the base material. The base material is a cemented carbide or a cermet. The coating includes an aluminum oxide layer containing a plurality of aluminum oxide crystal grains. The aluminum oxide layer includes: a first region made up of a region A on the rake face and a region B on the flank face; a second region on the rake face except for the region A; and a third region on the flank face except for the region B. The region A is a region from an edge ridgeline to an imaginary line on the rake face, wherein the edge ridgeline is a line at which an imaginary extension of the rake face and an imaginary extension of the flank face cross each other, and the imaginary line on the rake face is a line extending along the edge ridgeline and located 1 mm away from the edge ridgeline. The region B is a region from the edge ridgeline to an imaginary line on the flank face, wherein the imaginary line on the flank face is a line extending along the edge ridgeline and located 1 mm away from the edge ridgeline. The aluminum oxide layer satisfies a relation: b−a>0.5, where a is an average value of a TC(110) in the first region in texture coefficient TC(hkl), and b is an average value of the TC(110) in the second region or the third region in texture coefficient TC(hkl). These features enable the surface-coated cutting tool to have increased resistance to coating fracture including peel-off and chipping for example.

[2] Preferably, the a satisfies a relation: 2<a. Accordingly, the resistance to coating fracture including peel-off and chipping for example can further be increased.

[3] Preferably, the aluminum oxide layer is an $\alpha$-$Al_2O_3$ containing $\alpha$-$Al_2O_3$ crystal grains as a main component. Accordingly, the resistance to coating fracture including peel-off and chipping for example can further be increased.

[4] Preferably, the base material has a surface. The surface includes the rake face, the flank face, and a cutting edge face connecting the rake face to the flank face, and the base material has an oxygen concentration of less than or equal to 1 at. % at a depth position of 0.4 μm from the cutting edge face. Accordingly, the adhesiveness between the base material and the coating can be improved.

[5] Preferably, the base material has an oxygen concentration of less than or equal to 10 at. % at a depth position of 0.2 μm from the cutting edge face. Accordingly, the adhesiveness between the base material and the coating can further be improved.

[6] Preferably, the cutting edge face has a strain of less than or equal to 0.07. Accordingly, the adhesiveness between the base material and the coating can be improved as well.

[7] Preferably, the cemented carbide has a composition made up of 5 to 7 mass % of cobalt, 0.01 to 3 mass % of a carbide of a first metal, and the balance of tungsten carbide and inevitable impurities. The cermet has a composition made up of 5 to 25 mass % of cobalt or nickel, 5 to 40 mass % of tungsten carbide, and the balance of inevitable impurities and at least one selected from a carbide of the first metal, a nitride of the first metal, and a carbonitride of the first metal. The first metal is preferably at least one kind of metal selected from the group consisting of Group IV elements, Group V elements, and Group VI elements in the periodic table. Accordingly, a base material made of a cemented carbide or a cermet can be included that is excellent in balance between hardness and strength at high temperature.

[8] Preferably, the coating further includes a compound layer made from: at least one kind of first element selected from the group consisting of Group IV elements, Group V elements, and Group VI elements in the periodic table, aluminum, and silicon; and at least one kind of second element selected from the group consisting of boron, carbon, nitrogen, and oxygen. Accordingly, the quality of the coating can be improved.

[9] Preferably, the coating is a chemical vapor deposition film. Accordingly, the adhesiveness between the base material and the coating can be improved as well.

[10] A method for manufacturing a surface-coated cutting tool according to an aspect of the present disclosure is a method for manufacturing the above-described surface-coated cutting tool. The method includes: forming the coating on the base material; and performing a surface treatment on a portion of the coating, the portion corresponding to the first region. Accordingly, a surface-coated cutting tool having increased resistance to coating fracture including peel-off and chipping for example can be manufactured.

[11] Preferably, the surface treatment includes at least brushing or blasting. Accordingly, a surface-coated cutting tool having further improved resistance to coating fracture including peel-off and chipping for example can be manufactured.

[12] Preferably, the method for manufacturing a surface-coated cutting tool includes: preparing a base material precursor; and producing the base material by machining a surface of the base material precursor. The machining is one of a first grinding process of alternately repeating wet grinding and dry grinding; a second grinding process of performing low-feed low-depth-of-cut wet grinding, or a third grinding process of performing dry grinding. Accordingly, a surface-coated cutting tool having resistance to coating fracture including peel-off and chipping for example improved to a highest degree can be manufactured.

Details of Embodiments of the Invention

In the following, an embodiment (hereinafter also referred to as "present embodiment") of the present invention is described in further detail. In the drawings used for the following description of the embodiment, the same reference characters denote the same parts or corresponding parts.

The expression "A to B" as used herein is intended to define an upper limit and a lower limit of a certain range (i.e., from A to B inclusive). As to "A to B" where A is not followed by a unit symbol and only B is followed by a unit symbol, the unit of A is the same as the unit of B. Further, a compound or the like expressed herein by a chemical formula includes the compound with any of all conventionally known atomic ratios if the atomic ratio is not particularly limited, and the compound is not necessarily limited to the compound with a stoichiometric ratio. For example, in the case of an expression "TiAlN," the ratio of the number of atoms between the elements constituting TiAlN is not limited to Ti:Al:N=0.5:0.5:1, and includes all conventionally known ratios of the number of atoms. This is applied as well to any expressions of compounds other than "TiAlN." In the present embodiment, the metal element such as titanium (Ti), aluminum (Al), silicon (Si), tantalum (Ta), chromium (Cr) and the non-metal element such as nitrogen (N), oxygen (O), or carbon (C) may not necessarily constitute a stoichiometric composition.

Surface-Coated Cutting Tool

A surface-coated cutting tool according to the present embodiment has a rake face and a flank face. The rake face of the surface-coated cutting tool is chiefly a surface which is in contact with swarf of a workpiece during cutting. For example, in the explanatory diagram of FIG. 1, the top surface and the bottom surface of the surface-coated cutting tool are each a rake face. The flank face is chiefly a surface which faces a processed surface (a surface newly formed by cutting the workpiece). For example, in the explanatory diagram of FIG. 1, the flank face is the side surface of the surface-coated cutting tool. In the present embodiment, the boundary between the rake face and the flank face undergoes a surface treatment as described later herein to form a tool edge portion. The tool edge portion is usually a portion serving as a cutting edge (hereinafter also referred to simply as "edge") of the surface-coated cutting tool.

The shape of the tool edge portion may be any of a sharp edge (ridge at which the rake face and the flank face meet each other), a honed edge (sharp edge processed to be rounded), a negative land (beveled), a combination of the honed edge and the negative land, and the like. The tool edge portion which undergoes a surface treatment into a honed edge has an arcuate surface. The tool edge portion which undergoes a surface treatment into a negative land shape has a beveled surface. The tool edge portion which undergoes a surface treatment into a sharp edge shape has a ridgeline which is the boundary between the rake face and the flank face.

In order to determine the range of a below-described first region (a region A and a region B) for example, a line (also referred to as "edge ridgeline" hereinafter) at which respective imaginary extensions of the rake face and the flank face of the surface-coated cutting tool cross each other is herein necessary. This line corresponds to a ridgeline formed by a surface treatment of the tool edge portion into a sharp edge. This line is not present if a surface treatment is performed to form a honed edge or a negative land shape, because this line is replaced with the tool edge portion. In these cases as well, the following description is given in which the surface-coated cutting tool is regarded as having an imaginary edge ridgeline, in order to determine the range of the below-described first region (region A and region B) for example.

The surface-coated cutting tool includes a base material and a coating formed on the base material. The coating preferably covers the entire surface of the base material. However, even when a part of the base material is not covered with the coating or the makeup of the coating is partially different, such a surface-coated cutting tool does not go beyond the scope of the present invention.

The surface-coated cutting tool can suitably be used as a cutting tool such as drill, end mill, indexable insert for the drill, indexable insert for the end mill, indexable insert for milling, indexable insert for turning, metal-slitting saw, gear-cutting tool, reamer, tap, or the like. In the case where the surface-coated cutting tool is an indexable insert, the base material may have or may not have a chip breaker.

Coating

The coating includes an aluminum oxide layer containing a plurality of aluminum oxide (also expressed as "$Al_2O_3$" hereinafter) crystal grains (polycrystal).

In the present embodiment, the aluminum oxide layer is a layer containing at least $Al_2O_3$ as a part of the layer (a layer containing more than or equal to 50 mass % of $Al_2O_3$ is regarded as an $Al_2O_3$ layer), and may contain $ZrO_2$, $Y_2O_3$ (may also be regarded as a layer in which Zr or Y is be added to $Al_2O_3$), or the like. The aluminum oxide layer may further contain impurities such as chlorine, carbon, boron, nitrogen, and the like. The $Al_2O_3$ layer may alternatively be made up of $Al_2O_3$ and impurities only. The crystal structure of $Al_2O_3$ contained in the $Al_2O_3$ layer should not be limited to a particular crystal structure. For example, $Al_2O_3$ may be $\alpha$-$Al_2O_3$ (aluminum oxide having $\alpha$-type crystal structure), $\kappa$-$Al_2O_3$ (aluminum oxide having $\kappa$-type crystal structure), $\gamma$-$Al_2O_3$ (aluminum oxide having $\gamma$-type crystal structure), amorphous $Al_2O_3$, or a mixture thereof. In the following description, the illustrated aluminum oxide layer is an $\alpha$-$Al_2O_3$ layer containing $\alpha$-$Al_2O_3$ crystal grains as a main component.

"Containing $\alpha$-$Al_2O_3$ crystal grains as a main component" means that the $\alpha$-$Al_2O_3$ crystal grains occupy 90 mass % or more of $Al_2O_3$ crystal grains constituting the aluminum oxide layer. Preferably, "containing $\alpha$-$Al_2O_3$ crystal grains as a main component" also means that the $\alpha$-$Al_2O_3$ layer consists of the $\alpha$-$Al_2O_3$ crystal grains except for the case where crystal grains of at least one of $\gamma$-$Al_2O_3$ and $\kappa$-$Al_2O_3$ are inevitably contained.

The ratio of $\alpha$-$Al_2O_3$ crystal grains to the $Al_2O_3$ crystal grains constituting the aluminum oxide layer can be measured by analyzing diffraction peaks by means of an x-ray diffractometer.

First Region, Second Region, and Third Region

The $\alpha$-$Al_2O_3$ layer (aluminum oxide layer) includes a first region made up of a region A on the rake face and a region B on the flank face. The $\alpha$-$Al_2O_3$ layer further includes a second region on the rake face except for the region A. The $\alpha$-$Al_2O_3$ layer also includes a third region on the flank face except for the region B. The region A is a region from an edge ridgeline to an imaginary line on the rake face. The edge ridgeline is a line at which an imaginary extension of the rake face and an imaginary extension of the flank face cross each other. The imaginary line on the rake face is a line extending along the edge ridgeline and located 1 mm away from the edge ridgeline. The region B is a region from the edge ridgeline to an imaginary line on the flank face. The imaginary line on the flank face is a line extending along the edge ridgeline and located 1 mm away from the edge ridgeline. The first region therefore includes the edge ridgeline, and also includes a point of intersection (also referred to as "corner" hereinafter) of edge ridgelines, a point of intersection of the imaginary lines, and the point of intersection of the edge ridgeline and the imaginary line. The second region and the third region do not include the edge ridgeline.

TC(110) in First Region and Second Region

The $\alpha$-$Al_2O_3$ layer (aluminum oxide layer) satisfies a relation $b-a>0.5$ where a is an average value of TC(110) in the first region in texture coefficient TC(hkl) and b is an average value of TC(110) in the second region in texture coefficient TC(hkl). Accordingly, the (110) orientation is controlled to be relatively low in the cutting edge portion only, while the wear resistance based on high (110) orientation in the $\alpha$-$Al_2O_3$ layer is maintained, and thereby sudden chipping of the cutting edge can be suppressed.

TC(110) in Third Region

The second region is formed in the rake face. In some cases, it may be difficult to measure the texture coefficient TC(hkl) due to unevenness of the rake face. In such a case as well, the $\alpha$-$Al_2O_3$ layer (aluminum oxide layer) satisfies a relation $b-a>0.5$, where b is an average value of TC(110) in the third region and a is an average value of TC(110) in the first region. Accordingly, the (110) orientation is controlled to be relatively low in the cutting edge portion only, while the wear resistance based on the high (110) orientation in the $\alpha$-$Al_2O_3$ layer is maintained, and thereby sudden chipping of the cutting edge can be suppressed.

The "(110) orientation" in the $\alpha$-$Al_2O_3$ layer means that the (110) plane is a reflection plane exhibiting the highest numerical value of texture coefficient TC(hkl) among (hkl) reflection planes (eight reflection planes in the present embodiment described later herein) in an α-Al$_2$O$_3$ layer diffraction profile obtained through analysis by means of an x-ray diffractometer described later herein. Texture coefficient TC(hkl) can be defined by the following expression (1).

$$TC(hkl) = \frac{I(hkl)}{I_0(hkl)} \left\{ \frac{1}{n} \sum_1^n \frac{I(hkl)}{I_0(hkl)} \right\}^{-1} \quad (1)$$

In the expression (1), I(hkl) represents an x-ray diffraction intensity of a (hkl) reflection plane, and I$_0$(hkl) represents a standard intensity according to PDF card No. 00-042-1468 of the ICDD. In the expression (1), n represents the number of reflections used for the calculation. As (hkl) reflections, (012), (104), (110), (006), (113), (024), (116), and (300) are used. Therefore, n is eight in the present embodiment.

ICDD (registered trademark) is an abbreviation for International Center for Diffraction Data. PDF (registered trademark) is an abbreviation for Power Diffraction File.

TC(110) measured at any locations in the first region, the second region, and the third region of the α-Al$_2$O$_3$ layer can be expressed by the following expression (2).

$$TC(110) = \frac{I(110)}{I_0(110)} \left\{ \frac{1}{8} \sum_1^8 \frac{I(hkl)}{I_0(hkl)} \right\}^{-1} \quad (2)$$

This TC(hkl) can be measured through analysis by means of an x-ray diffractometer. TC(hkl) can for example be measured by means of an x-ray diffractometer (trade name: "SmartLab (registered trademark) 3" manufactured by Rigaku Corporation) under the following conditions.

characteristic x-ray: Cu—Kα
tube voltage: 45 kV
tube current: 200 mA
x-ray diffractometry: θ-2θ method
range of x-ray irradiation: A pinhole collimator is used to irradiate a range on the order of 0.3 mm in diameter with x-ray.

In the present embodiment, TC(110) is measured for example in the rake face of the surface-coated cutting tool. As long as it is measured in the rake face of the surface-coated cutting tool, a plurality of measurement points for measuring TC(110) can be set at any non-overlapping locations in the first region (region A), and similarly a plurality of measurement points can be set at any non-overlapping locations in the second region. The measurement points are irradiated with x-ray to obtain the values of TC(110). The values of a and b which are averages of these values can thus be calculated.

If it is difficult to measure texture coefficient TC(hkl) due to unevenness of the rake face, TC(110) may be measured in the flank face of the surface-coated cutting tool. In this case as well, a plurality of measurement points for measuring TC(110) can be set at any non-overlapping locations in the first region (region B) of the flank face, and similarly a plurality of measurement points can be set at any non-overlapping locations in the third region. The measurement points are irradiated with x-ray to obtain TC(110). The values of a and b which are averages of these values can thus be calculated.

Preferably, the measurement points are set by selecting flat portions on the first region, the second region, and the third region. Preferably, the measurement points are two or more non-overlapping points as described above. However, in such a case where measurement points to be set are inevitably overlapping on the first region, the second region, or the third region, only one measurement point may be set. If TC(110) at a measurement point is apparently an abnormal value, the abnormal value should be excluded.

In the present embodiment, as shown in FIG. 1 for example, measurement points (first measurement point 1, second measurement point 2, third measurement point 3, fourth measurement point 4, fifth measurement point 5) may be set at intervals of 0.7 mm from a corner 100 (corner which is a point of intersection of two edge ridgelines) along the diagonal line connecting corner 100 and a corner 200 each having an acute angle (θ=80°), out of the four vertexes formed by extending the rake face and the flank face. These measurement points are irradiated with x-ray under the above-described conditions to obtain data from x-ray diffraction (XRD) (also referred to as "diffraction profile" hereinafter) in the α-Al$_2$O$_3$ layer. Based on the diffraction profile in the α-Al$_2$O$_3$ layer, TC(110) can be calculated.

The first region is made up of: the region from the edge ridgeline to an imaginary line on the rake face, the imaginary line being located 1 mm away from the edge ridgeline and extending along the edge ridgeline (region A); and the region from the edge ridgeline to an imaginary line on the flank face, the imaginary line being located 1 mm away from the edge ridgeline and extending along the edge ridgeline (region B). The edge ridgeline itself is also included in the first region. Therefore, based on FIG. 1, first measurement point 1 and second measurement point 2 which are set at intervals of 0.7 mm from the corner along the diagonal line connecting corners 100 and 200 of an acute angle (θ=80°) are included in the first region. The average of the values of TC(110) measured at these measurement points is the value of a.

The second region is a region of the rake face except for region A. Therefore, third measurement point 3, fourth measurement point 4, and fifth measurement point 5 which are set at intervals of 0.7 mm along the aforementioned diagonal line subsequently to first measurement point 1 and second measurement point 2 are included in the second region. The average of the values of TC(110) measured at these measurement points is the value of b. In the present embodiment, a value of b−a calculated based on a and b is more than 0.5. As to the upper limit of b−a, a relation b−a<8 is met, since the upper limit of TC(110) is 8 based on the definition of the above expression (1).

In FIG. 1, the measurement points are set on the diagonal line extending from the corner of the surface-coated cutting tool toward the center thereof. The present embodiment, however, should not be limited to this. For example, in each of the first region, the second region, and the third region, a plurality of measurement points can be distributed as much as possible, and TC(110) can be measured at these measurement points.

For example, measurement points in the first region may be set at one point or two or more points on an intermediate line between the edge ridgeline and an imaginary line extending along the edge ridgeline and located 1 mm away from the edge ridgeline. Measurement points in the second region may be set at one point or two or more points on a line located 1 mm away toward the second region from the boundary between the first region and the second region (i.e., the imaginary line on the rake face extending along the edge ridgeline and located 1 mm away from the edge ridgeline). Further, measurement points in the third region may be set at one point or two or more points on a line located 1 mm away toward the third region from the boundary between the first region and the third region (the imaginary line on the flank face extending along the edge ridgeline and located 1 mm away from the edge ridgeline). Besides, for a surface-coated cutting tool in the shape of a regular polygon having four or more sides, the measurement points can be set on the diagonal line similarly to the example shown in FIG. 1. If the surface-coated cutting tool is circular in shape, the measurement points can be set at one given point on the edge ridgeline and one point or two or more points on a line passing through the center of the circle.

Average value a of TC(110) in the first region preferably satisfies a relation 2<a. Average value b of TC(110) in the second region or third region preferably satisfies a relation 3.5<b. The upper limit of a is 5, and the upper limit of b is 8. When these relations are satisfied, the height of the (110) orientation can be controlled to be relatively low in the cutting edge portion only, while maintaining the wear resistance based on the high (110) orientation in the α-Al$_2$O$_3$ layer. Accordingly, sudden chipping of the cutting edge can be suppressed.

When a meets a relation a≤2, the orientation in a specific direction [(110) orientation] in the first region of the α-Al$_2$O$_3$ layer (aluminum oxide layer) may be excessively low and the α-Al$_2$O$_3$ layer may not have the (110) orientation. In such a case, there is a possibility that the coating in the first region cannot have desired hardness and strength. The upper limit of a is 5. When a meets a relation 5<a, the orientation in a specific direction [(110) orientation] is excessively high in the first region of the α-Al$_2$O$_3$ layer and there is a possibility that sudden chipping of the cutting edge is prone to occur.

In the case where b meets a relation b 3.5, the orientation in a specific direction [(110) orientation] is excessively low in the α-Al$_2$O$_3$ layer across the whole tool and there is a possibility that the α-Al$_2$O$_3$ layer may not have the (110) orientation. In such a case, there is a possibility that the wear resistance of the α-Al$_2$O$_3$ crystal grains cannot be maintained in the whole tool.

Other Layers

The coating may have a single layer structure made up of a single aluminum oxide layer as described above, or a multilayer structure made up of a stack of two or more layers consisting of the aluminum oxide layer and another layer/other layers. The coating may be formed on a part (cutting edge face for example) of the surface of the base material as described above, or the entire surface of the base material.

In the case of the coating having the multilayer structure made up of a stack of two or more layers, preferably the coating further includes the aluminum oxide layer as described above and a compound layer (also referred to as "other layer(s)" hereinafter) made from: at least one kind of first element selected from the group consisting of Group IV elements (such as Ti, Zr, Hf), Group V elements (such as V, Nb, Ta), and Group VI elements (such as Cr, Mo, W) in the periodic table; and at least one kind of second element selected from the group consisting of boron, carbon, nitrogen, and oxygen. Accordingly, the adhesiveness between the base material and the coating can further be improved, and this coating is suitable as a coating of the surface-coated cutting tool. It should be noted that the other layer made of a combination of aluminum as a first element and oxygen as a second element is excluded, because this combination is aluminum oxide.

Specific examples of the compound layer (other layers) may be TiCNO layer, TiBN layer, TiC layer, TiN layer, TiAlN layer, TiSiN layer, AlCrN layer, TiAlSiN layer, TiAlNO layer, AlCrSiCN layer, TiCN layer, TiSiC layer, CrSiN layer, AlTiSiCO layer, TiSiCN layer, ZrO$_2$ layer, and the like. The compound layer is preferably a layer containing Ti (e.g. TiCN layer, TiN layer) since such a layer is particularly excellent in hardness, or preferably a layer containing Al (e.g. AlCrN layer) since such a layer is particularly excellent in oxidation resistance.

The TiCN layer as an example of the other layers is preferably located between the Al$_2$O$_3$ layer and the base material. The TiCN layer having a high wear resistance can impart a still more suitable wear resistance to the coating. The TiCN layer is particularly preferably formed by the MT-CVD (medium temperature CVD) method. The MT-CVD method enables films to be deposited at a relatively low temperature of about 850 to 900° C., which can reduce damages to the base material due to heating during the film deposition.

The coating may further include, as still other layers, a topmost layer and an intermediate layer, for example. The topmost layer is a layer located uppermost in the coating. The intermediate layer is a layer located between the topmost layer and the α-Al$_2$O$_3$ layer, between the α-Al$_2$O$_3$ layer and the TiCN layer, or between the TiCN layer and the base material, for example. The topmost layer may be a TiN layer, for example. The intermediate layer may be a TiCNO layer, for example.

In the present embodiment, preferably the coating is a chemical vapor deposition layer. Specifically, it is suitable to form the coating on the base material by the chemical vapor deposition (CVD) method as described later herein. The film deposition temperature of the CVD method is 800 to 1200° C. which is higher than that of the physical vapor deposition method. The CVD method thus provides an advantageous effect that the adhesiveness between the base material and the coating is improved, as compared with the physical vapor deposition method.

Preferably, the coating has a thickness of 0.3 to 20 μm. The coating having a thickness of 0.3 μm or more can sufficiently exhibit the characteristics of the coating. The coating having a thickness of 20 μm or less can suppress peel-off of the coating due to an excessively large thickness of the coating.

Each of respective thicknesses of the coating, the α-Al$_2$O$_3$ layer (aluminum oxide layer), and the other layer(s) is herein an average thickness. These thicknesses can be measured with a field emission scanning electron microscopy (FE-SEM) in accordance with the following method.

First, the surface-coated cutting tool is cut along a plane which is parallel with a normal line to the rake face of the surface-coated cutting tool so as to expose a cross section thereof. Subsequently, the exposed cross section is polished to produce a polished surface to be observed. When the thickness of the coating is measured, observation at a magnification of 5000× is carried out for five given sites (five fields of view) including the coating appearing on this polished surface to be observed, so as to determine the thickness of the coating. Finally, the average value of respective values of the five fields of view is determined, and the determined average value is identified as the average thickness of the coating. When respective thicknesses of the α-Al$_2$O$_3$ layer and the other layer(s) are measured, observation at a magnification of 5000× is carried out for five given sites (five fields of view) including the α-Al$_2$O$_3$ layer and the other layer(s) appearing on the polished surface to be observed, so as to determine each thickness. Finally, the average value of respective values of the five fields of view is determined, and the determined average value is identified as the average thickness of each of the $\alpha$-$Al_2O_3$ layer and the other layer(s).

The cross section of the base material covered with the coating may be polished by a conventionally known method. For example, the cross section of the base material may undergo ion milling using argon (Ar) ions to obtain a smoothed polished surface to be observed. The conditions for the ion milling with Ar ions are for example as follows.

accelerated voltage: 6 kV ion beam angle: 0 to 5° from a normal line to the rake face of the base material ion beam application time: 6 hours The smoothed polished surface to be observed may thereafter be analyzed by means of an FE-SEM.

Base Material

The base material has a surface. The surface includes a rake face, a flank face, and a cutting edge face connecting the rake face to the flank face. Specifically, the rake face included in the surface of the base material is a surface on the base material corresponding to the rake face of the surface-coated cutting tool. The flank face included in the surface of the base material is a surface on the base material corresponding to the flank face of the surface-coated cutting tool. The cutting edge face included in the surface of the base material is the one as described above. The cutting edge face may have an arcuate surface shape, a planar surface shape, a shape of a combination of a planer surface and an arcuate surface, or a sharp edge shape, as described below. Specifically, the cutting edge face included in the surface of the base material is a surface on the base material corresponding to the tool edge portion of the surface-coated cutting tool. The cutting edge face included in the base material is further described below with reference to FIGS. 2 to 4.

Figure 2:
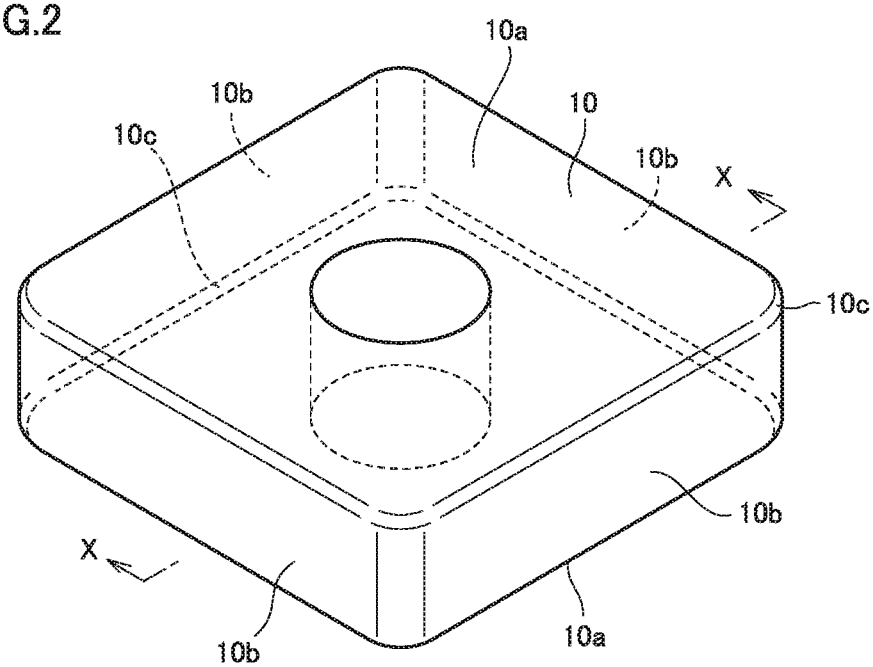
FIG. 2 is a perspective view showing an example of a base material.
Figure 3:
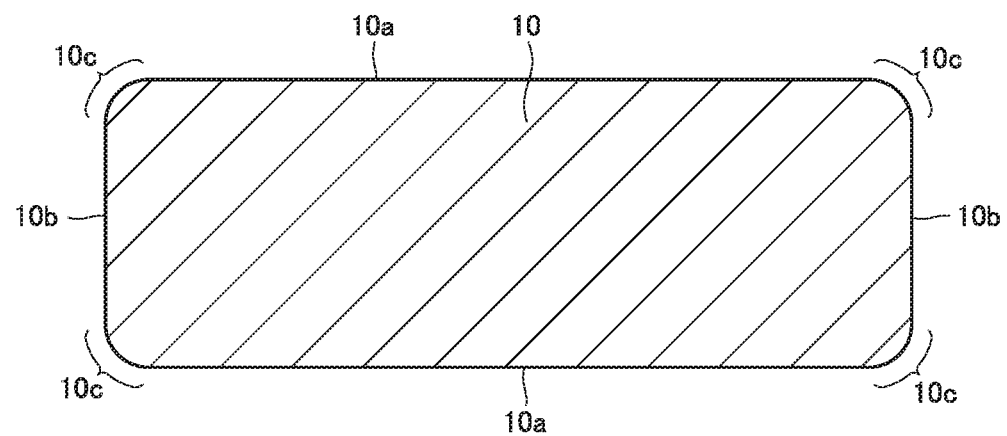
FIG. 3 is a cross-sectional view along line X-X as seen in the direction indicated by arrows in FIG. 2.

FIG. 2 is a perspective view showing an example of the base material. FIG. 3 is a cross-sectional view along line X-X as seen in the direction indicated by arrows in FIG. 2. The base material in such a shape is used as a base material of an indexable insert for turning, for example.

A base material 10 shown in FIGS. 2 and 3 has a surface including an upper surface, a lower surface, and four side surfaces. The overall shape of base material 10 shown in FIGS. 2 and 3 is a quadrangular prism which is flat in the left-to-right direction in FIGS. 2 and 3. Base material 10 has a through hole extending through the upper and lower surfaces. Of the four side surfaces, side surfaces adjacent to each other are connected to each other by an arcuate surface along the boundary between these side surfaces.

The top surface and the bottom surface of base material 10 are rake faces 10a, the four side surfaces thereof (and the arcuate surfaces each connecting the side surfaces to each other) are flank faces 10b, and an arcuate surface connecting rake face 10a to flank face 10b is a cutting edge face 10c.

Figure 4:
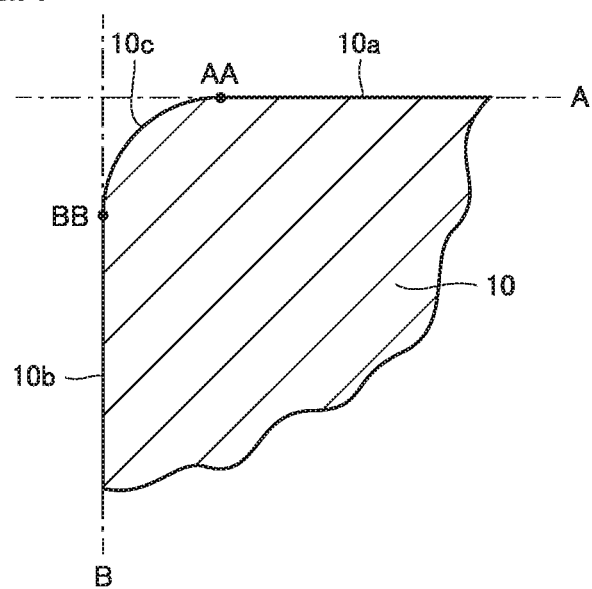
FIG. 4 is a partially enlarged view of FIG. 3.

FIG. 4 is a partially enlarged view of FIG. 3. FIG. 4 shows an imaginary plane A including rake face 10a, an imaginary boundary line AA at which rake face 10a and imaginary plane A part from each other, an imaginary plane B including flank face 10b, and an imaginary boundary line BB at which flank face 10b and imaginary plane B part from each other. In FIG. 4, each imaginary plane A, B is shown as a line and each imaginary boundary line AA, BB is shown as a dot. In FIG. 4, the surface within the region from imaginary boundary line AA to imaginary boundary line BB is cutting edge face 10c.

Cutting edge face 10c is a surface of base material 10. The ridgeline at which surfaces of base material 10 meet is machined to form cutting edge face 10c. Specifically, at least a part of the surface of a base material precursor made from a sintered material or the like is machined to form base material 10, and the surface of base material 10 is beveled by machining to form a surface called cutting edge face 10c.

FIGS. 2 to 4 show cutting edge face 10c in the shape of an arcuate surface (so-called honed edge). The shape of the cutting edge face, however, should not be limited to this. For example, the shape of the cutting edge face may be a planar surface (so-called negative land), a combination of a planar surface and an arcuate surface (so-called a combination of honed edge and negative land), or a sharp edge (ridge at which the rake face and the flank face meet each other).

In the case of the cutting edge face in the shape of a sharp edge, it is difficult to determine, based on the shape of the sharp edge, the boundary between the cutting edge face formed by machining and the rake face/flank face. Therefore, in the case of the base material having the shape of a sharp edge, the surface included in the region extending to a distance of 30 µm from the ridgeline at which the rake face and the flank face meet each other is herein identified as the cutting edge face, because this region can serve as a cutting edge of the surface-coated cutting tool.

Oxygen Concentration

The base material has an oxygen concentration of less than or equal to 1 at. % at a depth position of 0.4 µm from the cutting edge face. The oxygen concentration can be measured with an XPS (X-ray Photoelectron Spectroscopy) analyzer capable of carrying out XPS.

The XPS analyzer can be used to measure the ratio of atoms of a given kind (element distribution) at a given depth position in a target of measurement while etching the surface of the target by means of ions of Ar for example. XPS can thus be applied to determine the oxygen concentration at a depth position of 0.4 µm from the cutting edge face of the base material. The etching area may be 5000 to 50000 µm$^2$. The oxygen concentration is measured under vacuum.

Regarding the cutting edge face having a sharp edge shape, the cutting edge face includes a cutting edge face on the rake face side and a cutting edge face on the flank face side. In this case, "a depth position of 0.4 µm from the cutting edge face which is a surface of the base material" means a position at a depth of 0.4 µm from one of the cutting edge faces on the rake face side and the flank face side and at a depth of more than or equal to 0.4 µm from the other cutting edge face.

In the present embodiment, the coating is formed on the surface of the base material, and therefore, the surface of the base material is determined in the following way. First, XPS is used to etch the coating in the depth direction by ions of Ar for example, from the topmost surface of the surface-coated cutting tool corresponding to the cutting edge face of the base material. Next, the depth position at which an element specific to the raw material for the base material (e.g. an element forming a binder phase in the base material and may be Co, for example) is measured is identified as a cutting edge face of the base material.

The oxygen concentration may be an average value. Specifically, given three measurement sites are determined on the cutting edge face of the base material, and the oxygen concentration is measured at a depth position of 0.4 µm from each of the measurement sites. The average of respective oxygen concentrations measured at these sites may be determined as the oxygen concentration.

The inventors of the present invention measured the oxygen concentration at a plurality of measurement sites of the cutting edge face to find that there is no significant difference between the value taken at each measurement site and the average value. Therefore, the oxygen concentration may be measured at a given single site of the cutting edge face and the value taken at this site may be determined as the oxygen concentration. If the measured oxygen concentration has an apparently abnormal value, however, such a value should be excluded. The single site is preferably determined in a central portion of the cutting edge face, since this portion contributes significantly to characteristics of the cutting tool and is therefore appropriate as a site for evaluating the characteristics of the cutting tool.

In the surface-coated cutting tool of the present embodiment, the base material may have an oxygen concentration of less than or equal to 1 at. % at a depth position of 0.4 µm from the cutting edge face to thereby impart a high fracture resistance and accordingly a long life to the surface-coated cutting tool.

The inventors have found the following (a) to (c) by studies regarding the present disclosure:

(a) in the cutting edge face of the base material for the surface-coated cutting tool, unintended oxygen atoms have entered, and the oxygen concentration derived from the oxygen atoms is highest in the vicinity of the cutting edge face and decreases gradually toward the inside of the base material;

(b) the higher the oxygen concentration in the vicinity of the cutting edge face, oxygen atoms tend to enter deeper in the base material;

(c) in the base material in which oxygen atoms enter deep from the cutting edge face, cracks are likely to extend inward from the cutting edge face and hard particles forming the base material are likely to drop off.

Based on the above findings, the inventors suppose the reasons why the surface-coated cutting tool of the present disclosure has the high fracture resistance. Specifically, in the base material of the conventional surface-coated cutting tool, unintended oxygen atoms are present in a region from the cutting edge face inward to a certain depth position. In a region in which the oxygen atoms are present at a high concentration that may influence the physical properties of the base material ("high oxygen region"), the base material embrittles. Cracks generated in the cutting edge face are therefore likely to extend within the high oxygen region extending from the cutting edge face inward (in the depth direction of the base material).

Further, in the conventional surface-coated cutting tool, the high oxygen region has a relatively large width (the depth extending straight from the cutting edge face toward the inside of the base material). Consequently, large (long) cracks are generated. Accordingly, hard particles included in the high oxygen region and hard particles mostly located in the high oxygen region are likely to drop off.

In contrast, the base material of the present disclosure has an oxygen concentration of less than or equal to 1 at. % at a depth position of 0.4 µm from the cutting edge face, and the width of the high oxygen region is smaller than that of the conventional cutting tool or the base material does not have a high oxygen region. Therefore, the region in which brittlement may occur is smaller than the conventional cutting tool or there is no such a region, which provides higher hardness than the conventional cutting tool. Further, even when an origin of a crack is generated, extension of the crack is reduced as compared with the conventional cutting tool.

In particular, when the oxygen concentration at a depth position of 0.4 µm is less than or equal to 1 at. %, the width of the high oxygen region is likely to be smaller than the particle size of hard particles located in the surface of the base material. Therefore, even when cracks extend across the entire high oxygen region, the length of the cracks is likely to be smaller (shorter) than the particle size of hard particles located in the topmost surface of the base material, and eventually drop-off of hard particles is suppressed. The surface-coated cutting tool of the present disclosure can therefore have a high wear resistance and a high fracture resistance and hence a long life.

Preferably, the base material in the present embodiment has an oxygen concentration of less than or equal to 10 at. % at a depth position of 0.2 µm from the cutting edge face. In this case, extension of cracks can further be reduced and drop-off of hard particles can be suppressed. Accordingly, the life of the surface-coated cutting tool can further be extended. The oxygen concentration at a depth position of 0.4 µm from the cutting edge face and the oxygen concentration at a depth position of 0.2 µm from the cutting edge face are desirably 0 at. %.

Strain

In the present embodiment, preferably the cutting edge face has a strain of less than or equal to 0.07. The strain in the cutting edge face can be determined based on a base material diffraction profile of x-ray diffraction angle (2θ) and diffraction intensity based on x-ray diffractometry. The x-ray used at this time is preferably high-brightness x-ray like radiation beam, since high-precision measurement is possible.

Regarding a base material diffraction profile of x-ray diffraction angle (2θ) and diffraction intensity obtained by x-ray diffractometry, it is known that the diffraction peak expands (broadens) depending on each of crystallite size (i.e., particle size) and strain. Each of the diffraction peak depending on crystallite size and the diffraction peak depending on strain can be approximated by a Lorentz function to express the integral breadth β of the diffraction peak by the following expression (1), where βsize is the integral breadth of the diffraction profile depending on crystallite size, and βstrain is the integral breadth of the diffraction profile depending on strain.

$$\beta = \beta size + \beta strain \qquad (1)$$

βsize and βstrain are expressed by the following expression (2) and expression (3) where λ is wavelength of x-ray, ε is crystallite size, θ is incident angle of x-ray, η is strain (non-uniform lattice strain), and $\theta_0$ is Bragg angle. Further, the following expressions (2) and (3) are substituted into the above expression (1) to obtain the following expression (4).

$$\beta size = \lambda/(\varepsilon \cos \theta_0) \qquad (2)$$

$$\beta strain = \eta \tan \theta_0 \qquad (3)$$

$$\beta \cos \theta_0/\lambda = 1/\varepsilon + \eta \sin \theta_0/\lambda \qquad (4)$$

On a two-axis graph with the vertical axis representing $\beta \cos \theta_0/\lambda$ and the horizontal axis representing $\sin \theta_0/\lambda$, values determined from multiple diffraction profiles with different 2θ values are plotted, and the plots are linearly regressed.

The slope of the obtained regression line is strain (non-uniform lattice strain) and the reciprocal of the segment of the regression line is crystallite size.

The above-described strain may be an average value. Specifically, on the cutting edge face of the base material, three given measurement sites are determined. Respective diffraction profiles (multiple diffraction profiles that are different in incident angle) are obtained at given depth positions from the measurement sites, and the η value at each measurement site is calculated. The average of respective η values is determined as the strain. The measurement sites are located in a region of the base material at a thickness in the depth direction of 1.5 μm from the cutting edge face of the base material. Specifically, the strain is measured at each measurement site as an integral value of the strain of the base material in the region from the cutting edge face to the 1.5 μm depth.

The inventors calculated respective η values at multiple measurement sites of the cutting edge face to confirm that there is no significant difference between each value and the average value. Therefore, the strain may be measured at a given single site of the cutting edge face and the value taken at this site may be determined as the strain. If the measured strain has an apparently abnormal value, however, such a value should be excluded. The single site is preferably determined in a central portion of the cutting edge face, since the central portion of the cutting edge face contributes significantly to characteristics of the cutting tool and is therefore appropriate as a site for evaluating the characteristics of the cutting tool.

A sufficiently small strain of "less than or equal to 0.07" enables a still longer life of the surface-coated cutting tool. The surface-coated cutting tool having a small strain at such a position tends to have a high fracture resistance. The strain is more preferably less than or equal to 0.05. In this case, a still further longer life of the cutting tool is possible. It is most preferable that the strain is 0.

Composition of Base Material

The base material is made of a cemented carbide or a cermet. The cemented carbide may be a WC-based cemented carbide (also including a cemented carbide containing WC and Co, or alternatively a cemented carbide containing WC and Co and additionally a carbonitride of Ti, Ta, Nb or the like). The cermet may be a cermet containing TiC, TiN, TiCN or the like as a main component. In particular, the cermet is preferably a TiCN-based cermet. In the present embodiment, preferably the material for the base material has a composition intentionally containing no oxygen atoms.

Particularly when the WC-based cemented carbide is used as the base material, its structure may include free carbon and/or a deficient layer called η and ε phase, for example. Further, the surface of the base material may be modified. For example, the base material made of a cemented carbide may have a surface in which a β-free layer is formed. The base material made of a cermet may have a surface-hardened layer formed therein. The base material of which surface is modified still exhibits desired advantageous effects.

For the base material made of a cemented carbide, the cemented carbide preferably has a composition made up of 5 to 7 mass % of cobalt, 0.01 to 3 mass % of a carbide of a first metal, and the balance of tungsten carbide and inevitable impurities. For the base material made of a cermet, the cermet preferably has a composition made up of 5 to 25 mass % of cobalt or nickel, 5 to 40 mass % of tungsten carbide, and the balance of inevitable impurities and at least one selected from a carbide of the first metal, a nitride of the first metal, and a carbonitride of the first metal. Accordingly, the base material made of a cemented carbide or cermet particularly excellent in balance between hardness and strength at high temperature can be included.

The first metal is one or more kinds of metals selected from the group consisting of Group IV elements, Group V elements, and Group VI elements in the periodic table. The carbide of the first metal may therefore be TiC, ZrC, VC, NbC, TaC, $Cr_3C_2$, $Mo_2C$, or the like. The nitride of the first metal may be TiN, TaN, or the like. The carbonitride of the first metal may be TiCN, ZrCN, or the like.

Particle Size of Hard Particles

In the present embodiment, preferably the base material includes hard particles and the hard particles have a particle size of more than or equal to 0.5 μm.

The hard particles are crystal grains of a hard component among crystal grains constituting the base material. For example, the hard particles in the base material made of a WC-based cemented carbide are therefore WC particles, and hard particles in the base material made of a cermet are therefore TiCN particles and particles of a composite carbonitride containing Ti.

The particle size of the hard particles can be measured in the following way. First, a cross section of the base material is mirror-polished. A backscattered electron image of a given region in the cross section is observed with an electron microscope at a magnification of 5000×. Next, the diameter of a circumcircle of a crystal grain identified as a main component of the base material (i.e., circumcircle equivalent diameter) is measured. The measured diameter is identified as the particle size of the hard particles. In this way, respective particle sizes of at least 50 hard particles are calculated, and the average value of the calculated particle sizes is determined as the particle size of the hard particles.

If the particle size of the hard particles is more than or equal to 0.5 μm, the length of cracks is likely to be smaller than the particle size of the hard particles and eventually drop-off of the hard particles is suppressed, which enables a further extended life of the surface-coated cutting tool. If, however, the particle size of the hard particles is excessively large, the hardness of the base material itself tends to decrease. Preferably, therefore, the particle size of the hard particles is less than or equal to 5 μm. More preferably, the particle size of the hard particles is 0.5 to 4 μm.

As seen from the foregoing, the surface-coated cutting tool according to the present embodiment is excellent in resistance to coating fracture including peel-off and chipping for example, and therefore can have an extended life.

Method for Manufacturing Surface-Coated Cutting Tool

A method for manufacturing a surface-coated cutting tool according to the present embodiment is a method for manufacturing the above-described surface-coated cutting tool. The method includes the steps of: forming a coating on a base material; and performing a surface treatment on a portion of the coating corresponding to a first region. In this way, the surface-coated cutting tool having a higher resistance to coating fracture including peel-off and chipping for example can be manufactured.

Step of Forming Coating on Base Material

In the present embodiment, it is suitable to form a coating on the base material by the chemical vapor deposition (CVD) method. The film deposition temperature of the CVD method is 800 to 1200° C. which is higher than that of the physical vapor deposition method. The CVD method can therefore be used to produce the advantageous effect that the adhesiveness between the base material and the coating is enhanced as compared with the physical vapor deposition method. In the coating, layers other than the aluminum oxide layer can be formed under conventionally known conditions.

When an $\alpha$-$Al_2O_3$ layer is formed as the aluminum oxide layer, for example, the raw material gas may for example be a gas mixture including $AlCl_3$, HCl, $CO_2$, $H_2S$, and $H_2$, for example. Respective contents of the components of the gas mixture are: 1.3 to 2.5 vol % of $AlCl_3$, 2 to 6 vol % of HCl, 0.6 to 6 vol % of $CO_2$, 0.2 to 2 vol % of $H_2S$, and the balance of $H_2$. As to the conditions for the CVD method, the temperature is 950 to 1050° C., the pressure is 1 to 10 kPa, and the gas flow rate (total gas flow rate) is 10 to 150 L/min.

The thickness of the $\alpha$-$Al_2O_3$ layer and respective thicknesses of other layers can be adjusted by adjusting the film deposition time as appropriate (the film deposition rate of each layer is about 0.5 to 2.0 µm/hr).

Step of Performing Surface Treatment on Portion Corresponding to First Region of Coating In the present embodiment, the method includes the step of performing a surface treatment on a portion corresponding to the first region. In particular, the surface treatment preferably includes brushing or blasting. Accordingly, the surface-coated cutting tool can advantageously be manufactured that can suppress sudden chipping of the cutting edge while maintaining the wear resistance of the crystal grains in the aluminum oxide layer.

Specifically, after the coating is formed on the base material in the above-described manner, the surface treatment is performed on a portion of the coating, the portion corresponding to the first region. In the following, an example is described in which blasting, specifically wet blasting for example is performed as the surface treatment.

Figure 5:
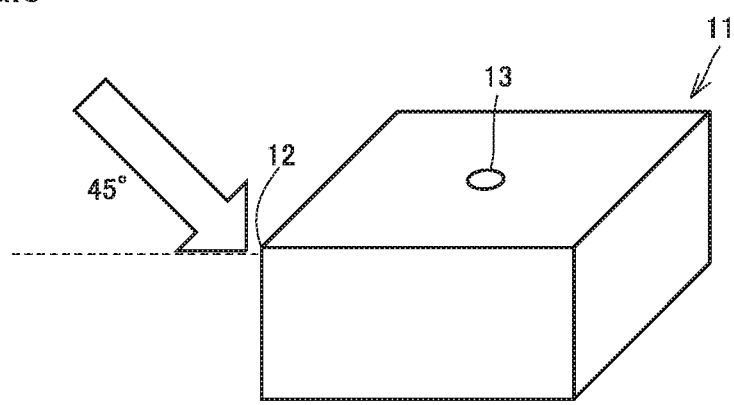
FIG. 5 is an explanatory diagram schematically showing the direction (angle) in which blast is applied to a portion corresponding to a first region of a coating during surface treatment.

As shown in FIG. 5, solid fine particles having an average particle size of 25 to 100 µm (e.g. ceramic abrasive grains having an average particle size of 70 µm) are applied from the leading end of a blast nozzle arranged at an angle of 10 to 80° (e.g.) 45° to an edge ridgeline 12 of a surface-coated cutting tool 11. Meanwhile, surface-coated cutting tool 11 is rotated at 10 to 50 rpm about an axial center, i.e., a through hole 13 at the center of the rake face.

At this time, the blasting pressure may be 0.05 to 0.25 MPa (e.g. 0.05 MPa), the blasting distance may be 2 to 100 mm (e.g. 50 mm), the blasting time may be 5 to 20 seconds, and the density of the solid fine particles may be 5 to 15 vol % (the remainder is a liquid in which water is a main component). Because the distance from edge ridgeline 12 to the leading end of the blast nozzle varies with rotation of surface-coated cutting tool 11, it is preferable to synchronize rotation of surface-coated cutting tool 11 with movement of the position of the blast nozzle so that the distance between edge ridgeline 12 and the leading end of the blast nozzle is kept constant.

The surface treatment performed on the portion of the coating corresponding to the first region should not be limited to the above-described method. Widely-known conventional brushing, barrel finishing, and various blasting treatments (sandblasting, shot peening, and the like) besides wet blasting, may be applied under known conditions.

Preferably, the method for manufacturing a surface-coated cutting tool according to the present embodiment further includes the steps of preparing a base material precursor and producing the base material by machining a surface of the base material precursor. Preferably the machining in the step of producing the base material is one of: a first grinding process of alternately repeating wet grinding and dry grinding; a second grinding process of performing low-feed low-depth-of-cut wet grinding; or a third grinding process of performing dry grinding.

The inventors focused on machining performed on the base material precursor. "Base material precursor" is machined so that its surface is beveled to form a cutting edge, to thereby form "base material." Specifically, machining is a process performed for imparting, to the base material precursor such as sintered material, properties suitable for a base material of the cutting tool. In order to machine a hard base material precursor, wet grinding is performed industrially for suppressing heat generation during machining or improving the process quality. The inventors found that water used for this wet grinding is a source of the aforementioned oxygen atoms.

Each step is now described in detail.

Step of Preparing Base Material Precursor

In this step, a base material precursor is prepared. The base material precursor may be a cemented carbide or a cermet as described above. The shape of the base material precursor is the one as described above and therefore similar to the shape of the base material except that the base material precursor does not yet have a cutting edge face.

Step of Producing Base Material

In this step, the surface of the base material precursor is machined. The machining is one of a first grinding process of alternately repeating wet grinding and dry grinding, a second grinding process of performing low-feed low-depth-of-cut wet grinding, or a third grinding process of performing dry grinding. In this way, the base material to be used for the surface-coated cutting tool of the present disclosure can be produced.

The surface of the base material precursor to be machined is a ridgeline vicinity portion including a ridgeline at which a first surface and a second surface of the base material precursor meet, and a vicinity of the ridgeline. The first surface and the second surface of the base material precursor are respective portions that are to form a rake face and a flank face of the base material, and the ridgeline vicinity portion of the base material precursor is a portion that is to form a cutting edge face of the base material.

For example, the ridgeline vicinity portion machined in an arcuate shape forms a honed cutting edge face as shown in FIG. 4, and the ridgeline vicinity portion machined in a flat shape forms a negative-land cutting edge face (not shown). Specifically, the machining is beveling of the ridgeline vicinity portion of the base material precursor.

First Grinding Process

Examples of the wet grinding (a process using water for grinding) in the first grinding process may include wet brushing, wet barrel finishing, and wet blasting. Conditions for this wet grinding are not particularly limited. For example, the wet grinding may be either high-feed high-depth-of-cut grinding or low-feed low-depth-of-cut grinding. In terms of the productivity, the wet grinding is preferably high-feed high-depth-of-cut wet grinding. Low feed and low depth of cut of the wet grinding herein vary depending on the type of grinding. For example, in the case of low-feed low-depth-of-cut wet brushing, the feed is less than or equal to 200 mm/sec and the depth of cut is less than or equal to 1.5 mm. In the case of high-feed and high-depth-of-cut wet grinding which is wet brushing for example, the feed is more than or equal to 300 mm/sec and the depth of cut is more than or equal to 3 mm.

Examples of the dry grinding (a process using no water for grinding) in the first grinding process may include dry brushing, dry barrel finishing, and dry blasting. Conditions for this dry grinding are not particularly limited. For example, the dry grinding may be either high-feed high-depth-of-cut grinding or low-feed low-depth-of-cut grinding. In terms of the productivity, the dry grinding is preferably high-feed high-depth-of-cut dry grinding. Low feed and low depth of cut of the dry grinding herein vary depending on the type of grinding. For example, in the case of low-feed low-depth-of-cut dry brushing, the feed is less than or equal to 150 mm/sec and the depth of cut is less than or equal to 1 mm. In the case of high-feed and high-depth-of-cut dry grinding which is dry brushing for example, the feed is more than or equal to 250 mm/sec and the depth of cut is more than or equal to 2.5 mm.

The reasons why the first grinding process enables manufacture of the aforementioned cutting tool with a low oxygen concentration are as follows. For the conventional machining of the base material precursor into the base material, the high-feed high-depth-of-cut wet grinding is performed. A first reason for this is a high productivity of the high-feed high-depth-of-cut wet grinding. A second reason for this is that the dry grinding has been considered as causing degradation of the base material due to heat generated during the grinding. A third reason for this is that the productivity of the low-feed low-depth-of-cut wet grinding has been considered as low.

However, this high-feed high-depth-of-cut wet grinding causes oxygen to enter from the cutting edge face toward the inside of the base material, resulting in decrease of the hardness of the base material itself and decrease of the adhesiveness between the base material and a coating.

In contrast, according to the method for manufacturing in the present embodiment, the machining in which wet grinding and dry grinding are repeated is performed, instead of the conventional machining in which high-feed high-depth-of-cut wet grinding is performed. Such machining provides the treated surface (cutting edge face) with the following.

A single wet grinding process is performed to bevel the base material precursor while oxygen enters from the surface of the base material precursor. The time taken to perform this wet grinding can be shortened as compared with the conventional process. Therefore, the width of a high oxygen region after the single wet grinding process is smaller than the conventional process. Further, the dry grinding subsequent to the wet grinding does not cause oxygen to enter into the base material precursor. Therefore, the dry grinding is performed for beveling while removing the high oxygen region formed during the preceding wet grinding.

Thus, consequently the width of the high oxygen region is significantly smaller than the conventional process, or there is no high oxygen region which may influence the physical properties of the base material. Accordingly, the aforementioned base material having an oxygen concentration of less than or equal to 1 at. % at a depth position of 0.4 μm from the cutting edge face is produced.

Although the number of times the wet grinding and the dry grinding are repeated is not particularly limited, each of the wet grinding and the dry grinding is performed at least once. Preferably, the wet grinding and the dry grinding are alternately repeated three or more times. In this way, the width of the high oxygen region formed in each wet grinding process can further be reduced. Accordingly, the final high oxygen region width can also further be reduced. The oxygen concentration itself in the high oxygen region can also be reduced.

Preferably, the initial process in the machining process is the wet grinding and the final process therein is the dry grinding. Accordingly, the width of the high oxygen region formed during each wet grinding can further be reduced, and the final width of the high oxygen region can be made significantly small. The oxygen concentration in the high oxygen region can also be made low. In addition, the strain in the cutting edge face of the base material can be controlled to be small by reducing the energy for a single process.

Second Grinding Process

Examples of the low-feed low-depth-of-cut wet grinding in the second grinding process may include wet brushing, wet barrel finishing, and wet blasting, like the first grinding process. The second grinding process suppresses entering of oxygen into the base material which is caused by the conventional high-feed high-depth-of-cut wet grinding, and therefore enables manufacture of the aforementioned cutting tool having a low oxygen concentration.

The wet grinding in the second grinding process is preferably performed at certain intervals, rather than continuously. Specifically, preferably a process in which the wet grinding is performed for a given time, subsequently stopped for a given time, and subsequently performed for a given time and so on is repeated. In this way, the advantageous effect of suppressing entering of oxygen can be improved.

Third Grinding Process

Examples of the dry grinding in the third grinding process may include dry brushing, dry barrel finishing, and dry blasting, like the first grinding process. Conditions for this dry grinding in the third grinding process are not particularly limited. For example, the dry grinding may be either high-feed high-depth-of-cut grinding or low-feed low-depth-of-cut grinding. In terms of the productivity, high-feed high-depth-of-cut dry grinding is preferable. The third grinding process suppresses entering of oxygen into the base material which is caused by the conventional high-feed high-depth-of-cut wet grinding, and therefore enables manufacture of the aforementioned cutting tool having a low oxygen concentration.

The first grinding process, the second grinding process, and the third grinding process are as described above. The machining is preferably the first grinding process. In this case, the cutting tool having a low oxygen concentration can be manufactured while keeping a high productivity.

EXAMPLES

In the following, the present invention is described in further detail with reference to Examples. The present invention, however, is not limited to them.

Production of Surface-Coated Cutting Tool of Sample No. 1

The surface-coated cutting tool of Sample No. 1 (indexable insert) was produced in the following way. The surface-coated cutting tool of Sample No. 1 is formed of a base material with the following specifications.

Insert Model No.: CNMG120408N-UX (manufactured by Sumitomo Electric Hardmetal)

Material: cemented carbide specified by JIS B4120 (2013)

Production of Base Material

First, raw material powder made up of a mixture having a composition: 2.0 mass % NbC, 6 mass % Co, and the balance WC (containing inevitable impurities) was press-formed in a predetermined shape, and thereafter sintered at 1300 to 1500° C. for 1 to 2 hours. Accordingly, a base material precursor was obtained.

Next, on a ridgeline vicinity portion of the base material precursor, the below-described wet grinding and dry grinding were alternately repeated in this order five times. The ridgeline vicinity portion of the base material precursor was thus machined (honed) so that an arcuate cutting edge face having a radius of 0.05 mm (R=0.05 mm) was formed. In this way, the base material for Sample No. 1 was produced.

Wet Grinding
type: barrel finishing
media: plastic
process liquid: water
time: 15 minutes Dry Grinding
type: brushing
brush: nylon
rotational speed: 100 rpm
depth of cut: 0.8 mm
feed: 120 mm/sec
process liquid: none
time: 1 minute
paste: diamond paste with an average particle size of 10 μm or less (liquid component contained in the paste is solid oil)

Formation of Coating

Next, a CVD apparatus was used to form a coating on the entire surface of the base material for Sample No. 1 under the conditions of pressure, temperature, and gas mixture composition shown in Table 1. Specifically, a TiN layer with a thickness of 0.3 μm, a TiCN layer with a thickness of 8 μm, an α-$Al_2O_3$ layer with a thickness of 5.5 μm, and a TiN layer with a thickness of 0.7 μm were stacked in this order from the surface of the base material to thereby produce the coating. "MT-TiCN" in Table 1 means that a TiCN film was formed in a relatively mild temperature environment of 850 to 950° C. relative to other CVD methods.

TABLE 1

| coating layer | gas mixture composition (vol %) | temperature (° C.) | pressure (kPa) |
|---|---|---|---|
| TiN (lowermost layer) | $TiCl_4$: 1.0%, $N_2$: 40.0%, $H_2$: balance | 800 | 7 |
| TiN (other than lowermost layer) | $TiCl_4$: 2.0%, $N_2$: 30.0%, $H_2$: balance | 1000 | 20 |
| MT-TiCN | $TiCl_4$: 2.0%, $N_2$: 20.0%, | 900 | 10 |

TABLE 1-continued

| coating layer | gas mixture composition (vol %) | temperature (° C.) | pressure (kPa) |
|---|---|---|---|
| α-$Al_2O_3$ | $CH_3CN$: 0.5%, $H_2$: balance $AlCl_3$: 3.0%, $CO_2$: 3.5%, $H_2S$: 0.4%, HCl: 3.0%, $H_2$: balance | 980 | 6 |

Surface Treatment

Next, the following surface treatment (wet blasting) was performed on a portion, corresponding to the first region, of the coating formed on the surface of the base material of Sample No. 1. Specifically, while the base material having the coating formed on the surface of the base material was rotated about the through hole, as an axial center, in the rake face at a rate of 60 rpm, ceramic (aluminum oxide) abrasive grains having a grain size of 70 μm were applied from the leading end of a blast nozzle arranged in the direction of 45° with respect to an imaginary ridgeline formed by an imaginary plane including the rake face and an imaginary plane including the flank face for performing wet blasting. At this time, the blasting pressure of the ceramic abrasive grains was 0.10 MPa, the blasting time was 5 to 10 seconds, the density was 10 vol % (the remainder is a solvent in which water was a main component). Further, the blasting distance from the blast nozzle to the cutting edge face on the base material was 10 mm, and the blasting distance from the blasting nozzle to nose R on the base material was 15 mm. In this way, the surface-coated cutting tool of Sample No. 1 was produced.

Production of Surface-Coated Cutting Tool of Sample No. 2

The surface-coated cutting tool (indexable insert) of Sample No. 2 was produced in the following way. The surface-coated cutting tool of Sample No. 2 is formed of the base material with the following specifications.

Insert Model No.: CNMG120408N-UX (manufactured by Sumitomo Electric Hardmetal)

Material: cermet of grade P20

Production of Base Material

First, raw material powder made up of a mixture having a composition: 7 mass % NbC, 7 mass % $Mo_2C$, 10 mass % Co, 5 mass % Ni, 20 mass % WC, and the balance TiCN (containing inevitable impurities) was press-formed in a predetermined shape, and thereafter sintered at 1300 to 1650° C. for 1 to 2 hours. Accordingly, a base material precursor was obtained. Then, machining was performed on the base material precursor under the same conditions as Sample No. 1. Thus, the base material for Sample No. 2 was produced.

Formation of Coating

On the base material for Sample No. 2, a coating was formed under the same conditions as those for forming the coating on the base material for Sample No. 1, and a surface treatment was performed on the coating.

Production of Surface-Coated Cutting Tools of Sample Nos. 3, 4, 5

The surface-coated cutting tools of Sample Nos. 3, 4, and 5 were produced in the same way as Sample No. 1 except that the machining for respective base material precursors was changed, specifically except that the process time and the number of repetition times of each of the wet grinding and the dry grinding were changed.

Production of Surface-Coated Cutting Tool of Sample No. 6

The surface-coated cutting tool of Sample No. 6 was produced in the same way as Sample No. 1 except that the machining for the base material precursor was changed so that only the conventional wet grinding was performed.

Production of Surface-Coated Cutting Tool of Sample No. 7

The surface-coated cutting tool of Sample No. 7 was produced in the same way as Sample No. 1 except that the machining for the base material precursor was only the conventional wet grinding and no surface treatment was performed on the first region of the coating formed on the surface of the base material.

Production of Surface-Coated Cutting Tool of Sample No. 8

The surface-coated cutting tool of Sample No. 8 was produced in the same way as Sample No. 2 except that the machining for the base material precursor was only the conventional wet grinding and no surface treatment was performed on the first region of the coating formed on the surface of the base material.

Production of Surface-Coated Cutting Tool of Sample No. 9

The surface-coated cutting tool of Sample No. 9 was produced in the same way as Sample No. 1 except that no surface treatment was performed on the first region of the coating formed on the surface of the base material.

In this way, the surface-coated cutting tools of Sample Nos. 1 to 9 were produced. The surface-coated cutting tools of Sample Nos. 1 to 6 are Examples and the surface-coated cutting tools of Sample Nos. 7 to 9 are Comparative Examples. For the below-described evaluation of various characteristics (oxygen concentration, strain, TC(110), and fracture resistance test), four surface-coated cutting tools were produced for each group of Sample Nos. 1 to 9.

Evaluation of Characteristics

Measurement of Oxygen Concentration and Strain

For the surface-coated cutting tools of Sample Nos. 1 to 9, each of the oxygen concentration at a depth position of 0.4 µm from the cutting edge face, the oxygen concentration at a depth position of 0.2 µm from the cutting edge face, and the strain in the cutting edge face (strain at a depth position of 1.5 µm from the cutting edge face) was measured in the above-described way.

Each of the oxygen concentrations and the strain was measured at given three measurement sites of the cutting edge face (honed surface with R=0.05 mm), and the average value of the measurements was calculated. One of the three measurement sites was a central portion of the cutting edge face. The calculated oxygen concentrations and strain (average values) are shown in Table 2.

The following apparatuses were used.

XPS analyzer (for measurement of oxygen concentration): trade name "JPS-9030" manufactured by JEOL Ltd.

x-ray apparatus (for measurement of strain): facility name "SPring-8," Japan Synchrotron Radiation Research Institute: JASRI Conditions for the radiation (high brightness x-ray) of SPring-8 used for measurement of strain by x-ray diffractometry are as follows.

beam line: BL16XU
incident x-ray energy: 10 keV
incident angle: 9.5°
scanning range: 18° to 97° at 2θ

In Table 2, the column "oxygen concentration at % (0.4 µm)" indicates the oxygen concentration (atomic %) at a depth position of 0.4 µm from the cutting edge face, and the column "oxygen concentration at % (0.2 µm)" indicates the oxygen concentration (atomic %) at a depth position of 0.2 µm from the cutting edge face.

Measurement of TC(110)

For the surface-coated cutting tools of Sample Nos. 1 to 9, an x-ray diffractometer (trade name: "SmartLab (registered trademark) 3" manufactured by Rigaku Corporation) was used to obtain a diffraction profile of the $\alpha$-$Al_2O_3$ layer in accordance with the θ-2θ method using Cu—Kα x-ray. The tube voltage was 45 kV and the tube current was 200 mA. As to the range of x-ray irradiation, a pinhole collimator was used to apply x-ray to a range with a diameter of 0.3 mm on the rake face.

On the surface-coated cutting tools of Sample Nos. 1 to 9, x-ray irradiation sites were defined based on imaginary edge ridgelines. Each imaginary edge ridgeline is a line at which an imaginary extension of a rake face and an imaginary extension of a flank face meet each other. Specifically, as shown in FIG. 1, measurement points (first measurement point 1, second measurement point 2, third measurement point 3, fourth measurement point 4, fifth measurement point 5) were set at 0.7 mm intervals from corner 100 along the diagonal line connecting corner 100 and corner 200 of the rake face. Corners 100 and 200 are each a rake face corner having an acute angle (θ=80°, the angle formed by imaginary two edge ridgelines that cross each other). To these measurement points, x-ray was applied under above-indicated conditions. From the obtained diffraction profile of the $\alpha$-$Al_2O_3$ layer, TC(110) at each measurement site was calculated. The results of the measurement are shown in Table 2 below.

On the surface-coated cutting tools of Sample Nos. 1 to 9, the first region includes the region (region A) from the edge ridgeline to an imaginary line on the rake face extending along the edge ridgeline and located 1 mm away from the edge ridgeline. First measurement point 1 and second measurement point 2 are therefore included in the first region. The second region is a region on the rake face except for the region A.

Third measurement point 3, fourth measurement point 4, and fifth measurement point 5 are therefore included in the second region. Thus, the average value of TC(110) obtained at first measurement point 1 and second measurement point 2 is the value of a. The average value of TC(110) obtained at third measurement point 3, fourth measurement point 4, and fifth measurement point 5 is the value of b.

Fracture Resistance Test

With the surface-coated cutting tools of Sample Nos. 1 to 9, cutting was performed under the following cutting conditions. The condition of the cutting edge and whether the coating had been peeled off or not were visually inspected after three minutes of cutting time. The results of the test are also shown in Table 2. In Table 2, "normal wear" means that there was only a wear track and fine chipping or fracture was not identified on the cutting edge. "Minute chipping" means that one to three chipping sites were identified while no fracture was identified on the cutting edge. "Chipping" means that four to eight fine chipping sites were identified while no fracture was identified on the cutting edge. "Significant chipping" means that either fracture or more than eight fine chipping sites were at least identified on the cutting edge.

Cutting Conditions workpiece: SCM415 (JIS) grooved material
cutting speed: 150 m/min
feed: 0.2 mm/rev
depth of cut: 1.5 mm
cutting liquid: water-soluble cutting oil
evaluation: comparison of the cutting edge condition and occurrence/non-occurrence of coating peel-off after 3-minute cutting Nos. 1 to 6 are surface-coated cutting tools having increased resistance to coating fracture including peel-off and chipping, as compared with Sample Nos. 7, 8, and 9 that do not satisfy the relation b−a>0.5.

The embodiments and Examples of the present invention are those as described above. It is originally intended that features of the above-described embodiments and Examples may be combined or modified in various manners as appropriate.

It should be construed that the embodiments and examples disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1 first measurement point; 2 second measurement point; 3 third measurement point; 4 fourth measurement point; 5 fifth measurement point; 10 base material; 10a rake face; 10b flank face; 10c cutting edge face; 11 surface-coated cutting tool; 12 edge ridgeline; 13 through hole; 100 corner; 200 corner

The invention claimed is:
1. A surface-coated cutting tool having a rake face and a flank face,
the surface-coated cutting tool comprising a base material and a coating formed on the base material,
the base material being a cemented carbide or a cermet,

TABLE 2

| Sample No. | oxygen concentration at % (0.4 μm) | oxygen concentration at % (0.2 μm) | strain | base material | TC(110) 1st measurement point | 2nd measurement point | 3rd measurement point | 4th measurement point | 5th measurement point | average a | average b | b − a | Cutting performance cutting edge condition | peel |
|---|---|---|---|---|---|---|---|---|---|---|---|---|---|---|
| 1 | 0.8 | 8.5 | 0.02 | cemented carbide | 4.54 | 4.78 | 5.34 | 5.6 | 5.73 | 4.66 | 5.56 | 0.9 | normal wear | no peel |
| 2 | 0.8 | 6.3 | 0.03 | cermet | 2.35 | 2.54 | 3.4 | 4.3 | 3.6 | 2.45 | 3.77 | 1.32 | normal wear | no peel |
| 3 | 0.7 | 5.3 | 0.06 | cemented carbide | 3.23 | 3.34 | 4.56 | 4.58 | 5.12 | 3.29 | 4.75 | 1.46 | normal wear | no peel |
| 4 | 0.9 | 5.4 | 0.09 | cemented carbide | 3.23 | 3.34 | 4.56 | 4.58 | 5.12 | 3.29 | 4.75 | 1.46 | minute chipping | no peel |
| 5 | 0.7 | 11.3 | 0.14 | cemented carbide | 3.23 | 3.34 | 4.56 | 4.58 | 5.12 | 3.29 | 4.75 | 1.46 | minute chipping | no peel |
| 6 | 1.2 | 13.2 | 0.08 | cemented carbide | 3.23 | 3.34 | 4.56 | 4.58 | 5.12 | 3.29 | 4.75 | 1.46 | chipping | no peel |
| 7 | 1.1 | 14.1 | 0.12 | cemented carbide | 4.2 | 4.23 | 4.43 | 4.36 | 4.67 | 4.22 | 4.49 | 0.27 | significant chipping | peel |
| 8 | 1.3 | 14.2 | 0.32 | cermet | 4.5 | 4.21 | 4.56 | 4.58 | 4.65 | 4.36 | 4.6 | 0.24 | significant chipping | peel |
| 9 | 0.8 | 8.5 | 0.02 | cemented carbide | 4.2 | 4.23 | 4.43 | 4.36 | 4.67 | 4.22 | 4.49 | 0.27 | significant chipping | peel |

Test Results and Analysis

As shown in Table 2, Sample Nos. 1 to 6 satisfied the relation b−a>0.5 and no peel-off of the coating was identified. Favorable results were also obtained from the fracture resistance test. In particular, it has been found that Sample Nos. 1 to 3 with a sufficiently low oxygen concentration and a sufficiently small strain are evaluated to be "normal wear" in the fracture resistance test and therefore have high fracture resistance. It is seen from the foregoing that Sample the coating including an aluminum oxide layer containing a plurality of aluminum oxide crystal grains,
the aluminum oxide layer including:
  a first region made up of a region A on the rake face and a region B on the flank face;
  a second region on the rake face except for the region A; and
  a third region on the flank face except for the region B,
the region A being a region from an edge ridgeline to an imaginary line on the rake face, wherein the edge ridgeline is a line at which an imaginary extension of the rake face and an imaginary extension of the flank face cross each other, and the imaginary line on the rake face is a line extending along the edge ridgeline and located 1 mm away from the edge ridgeline, the region B being a region from the edge ridgeline to an imaginary line on the flank face, wherein the imaginary line on the flank face is a line extending along the edge ridgeline and located 1 mm away from the edge ridgeline, the aluminum oxide layer satisfying a relation: b−a>0.5, where a is an average value of a TC(110) in the first region in texture coefficient TC(hkl), and b is an average value of the TC(110) in the second region or the third region in texture coefficient TC(hkl), wherein the base material has a surface, the surface includes the rake face, the flank face, and a cutting edge face connecting the rake face to the flank face, and the base material has an oxygen concentration of less than or equal to 1 at. % at a depth position of 0.4 μm from the cutting edge face.

2. The surface-coated cutting tool according to claim 1, wherein the a satisfies a relation: 2<a.

3. The surface-coated cutting tool according to claim 1, wherein the aluminum oxide layer is an α-Al2O3 layer containing α-Al2O3 crystal grains as a main component.

4. The surface-coated cutting tool according to claim 1, wherein the base material has an oxygen concentration of less than or equal to 10 at. % at a depth position of 0.2 μm from the cutting edge face.

5. The surface-coated cutting tool according to claim 1, wherein the cutting edge face has a strain of less than or equal to 0.07.

6. The surface-coated cutting tool according to claim 1, wherein the cemented carbide has a composition made up of 5 to 7 mass % of cobalt, 0.01 to 3 mass % of a carbide of a first metal, and the balance of tungsten carbide and inevitable impurities, the cermet has a composition made up of 5 to 25 mass % of cobalt or nickel, 5 to 40 mass % of tungsten carbide, and the balance of inevitable impurities and at least one selected from a carbide of the first metal, a nitride of the first metal, and a carbonitride of the first metal, and the first metal is at least one kind of metal selected from the group consisting of Group IV elements, Group V elements, and Group VI elements in the periodic table.

7. The surface-coated cutting tool according to claim 1, wherein the coating further includes a compound layer made from:

at least one kind of first element selected from the group consisting of Group IV elements, Group V elements, and Group VI elements in the periodic table, aluminum, and silicon; and at least one kind of second element selected from the group consisting of boron, carbon, nitrogen, and oxygen, and wherein the compound layer is located between the aluminum oxide layer and the base material, uppermost in the coating or between a topmost layer and the aluminum oxide layer.

8. The surface-coated cutting tool according to claim 1, wherein the coating is a chemical vapor deposition film.

9. A method for manufacturing a surface-coated cutting tool according to claim 1, the method comprising:

forming the coating on the base material; and performing a surface treatment on a portion of the coating, the portion corresponding to the first region.

10. The method for manufacturing a surface-coated cutting tool according to claim 9, wherein the surface treatment includes at least brushing or blasting.

11. The method for manufacturing a surface-coated cutting tool according to claim 9, the method comprising:

preparing a base material precursor; and producing the base material by machining a surface of the base material precursor, the machining being one of a first grinding process of alternately repeating wet grinding and dry grinding;

a second grinding process of performing low-feed low-depth-of-cut wet grinding, or a third grinding process of performing dry grinding.

* * * * *

UNITED STATES PATENT AND TRADEMARK OFFICE
CERTIFICATE OF CORRECTION

PATENT NO. : 11,014,169 B2  
APPLICATION NO. : 16/328225  
DATED : May 25, 2021  
INVENTOR(S) : Hideaki Kanaoka et al.

Page 1 of 1

It is certified that error appears in the above-identified patent and that said Letters Patent is hereby corrected as shown below:

In the Claims

In Claim 3, Column 27, Lines 26 and 27, "α-A1203" should read -- α-Al2O3 --.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*